United States Patent
Nilén et al.

(10) Patent No.: US 9,859,754 B2
(45) Date of Patent: Jan. 2, 2018

(54) COMPUTER SYSTEMS AND COMPUTER-IMPLEMENTED METHODS FOR WARNING USERS OF OVERLOAD CONDITIONS IN POWER DISTRIBUTION SYSTEMS

(71) Applicant: Emerson Network Power, Energy Systems, North America, Inc., Warrenville, IL (US)

(72) Inventors: Carl Johan Henrik Nilén, Stockholm (SE); Kjell Gunnar Lövqvist, Huddinge (SE)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 775 days.

(21) Appl. No.: 14/272,611

(22) Filed: May 8, 2014

(65) Prior Publication Data

US 2015/0323574 A1    Nov. 12, 2015

(51) Int. Cl.
G01R 21/00    (2006.01)
H02J 13/00    (2006.01)
G01R 31/40    (2014.01)
G01R 19/25    (2006.01)
G01R 31/28    (2006.01)
H02J 3/32    (2006.01)

(52) U.S. Cl.
CPC ........ *H02J 13/001* (2013.01); *G01R 19/2513* (2013.01); *G01R 19/2516* (2013.01); *G01R 31/2846* (2013.01); *G01R 31/40* (2013.01); *H02J 3/32* (2013.01); *Y02E 60/722* (2013.01); *Y04S 10/14* (2013.01); *Y04S 10/40* (2013.01)

(58) Field of Classification Search
CPC ................................. G01R 21/01; G01R 13/02
See application file for complete search history.

(56) References Cited

U.S. PATENT DOCUMENTS 7,099,784 B2    8/2006    Spitaels et al.
7,449,797 B2    11/2008   Takahashi
(Continued)

FOREIGN PATENT DOCUMENTS

EP    2498364    9/2012
KR    10-2013-0022760    3/2013

*Primary Examiner* — Elias Desta
(74) *Attorney, Agent, or Firm* — Harness, Dickey & Pierce, P.L.C.

(57) ABSTRACT

A computer-implemented method includes linking a plurality of load distribution points in a power distribution unit to a plurality of electrical loads in response to user input, receiving data indicative of one or more electrical parameters associated with the plurality of load distribution points, selecting a visual indicator from a group of indicators based on the one or more electrical parameters associated with the load distribution point for each of the plurality of load distribution points, and displaying the selected visual indicators for the plurality of load distribution points on a visual display for viewing by a user. Each of the electrical loads are electrically coupled to one or more of the plurality of load distribution points. Example computer systems and non-transitory computer readable medium including computer executable instructions for performing one or more computer-implemented methods are also disclosed.

19 Claims, 13 Drawing Sheets

(56) References Cited

U.S. PATENT DOCUMENTS

| | | | |
|---|---|---|---|
| 8,058,958 B2* | 11/2011 | West | H02J 9/005 |
| | | | 336/5 |
| 8,355,234 B2 | 1/2013 | Nilman-Johansson et al. | |
| 9,453,869 B1* | 9/2016 | Parkin | G01R 31/02 |
| 2006/0161270 A1* | 7/2006 | Luskin | G05B 15/02 |
| | | | 700/22 |
| 2012/0054527 A1 | 3/2012 | Pfeifer et al. | |
| 2012/0109389 A1 | 5/2012 | Covaro | |

* cited by examiner

FIG. 4

| Home > Settings | | | | | Welcome: admin \| Logout |
|---|---|---|---|---|---|
| Charge \| ECO \| LVD \| Rectifiers \| Battery Test \| Individual Load Mgmt \| Site Power Consumption Map | | | | | |
| Signal | Value | Time | Set Value | | Set |
| Battery Type Number | 1 | --- | | 1-10 | Set |
| Rated Capacity | 100Ah | 2013-07-25 15:07:48 | | 50-50000 | Set |
| Number of Battery Shunts | 1 | 2013-07-17 06:34:29 | 1 ▽ | | Set |
| Action on Very High Battery Temp | Disabled | --- | ⊙Disabled ○Lowering Voltage | | Set |
| Voltage on Very High Batt Temp | 48V | --- | | 45-55 | Set |
| Very Hi Temp Volt Setpoint (24V) | 24V | --- | | 22.5-27.5 | Set |
| Low Capacity Point | 75% | --- | | 25-100 | Set |
| Float Charge Voltage | 54.8V | 2013-07-25 16:09:04 | | 42-58 | Set |
| Float Charge Voltage (24V) | 26.8V | --- | | 21-29 | Set |
| Equalize Charge Voltage | 56.4V | --- | | 42-58 | Set |
| Equalize Charge Voltage (24V) | 28.2V | --- | | 21-29 | Set |
| Battery Current Limit | 0.1C10 | --- | | 0.1-0.25 | Set |
| Over Current Limit | 0.3C10 | --- | | 0.3-1 | Set |

⌂ All Alarms(4)  △ Observation(0)  △ Major(2)  △ Critical(2)   ☐ Auto Popup

| Index | Alarm Level | Relative | Signal Name | Sample time |
|---|---|---|---|---|
| 1 | CA | Rectifier Group | Rectifier Lost | 2013/08/26 11:44:40 |
| 2 | MA | SMDUH 8 | Communication Fail | 2013/08/26 11:41:49 |
| 3 | MA | Converter Group | All Converters Comm Fail | 2013/08/26 11:41:36 |
| 4 | CA | Power System | SPD ◂ | 2013/08/21 10:21:09 |

Sidebar:
- ⌂ Home
- ✱ Settings
  - ⊙ History Log
  - ⊙ System Inventory
  - ⊙ Advanced Settings
  - ⊙ Install Wizard
- Controller Specifications
  - Rectifiers: 2
  - Converters: 0
- System Specifications
  - Product Model: NSC3
  - Serial Number: 03130400103
  - Hardware Version: A01
  - Software Version: 0.01T05
  - Configuration: 1.00

| | Home > SMDUH | | | ⦵Welcome: admin \| Logout |
|---|---|---|---|---|
| ⌂ Home | DC | SMDUH | | |
| ✕ Settings | ▦ SMDUH 8 | | | |
| ⦿ History Log | Signal | Value | Signal | Value |
| ▦ System Inventory | Load 1 Current | 0.00A | Load 2 Current | 0.00A |
| ⚙ Advanced Settings | Load 3 Current | 0.00A | Load 4 Current | 0.00A |
| ⚙ Install Wizard | Load 5 Current | 0.00A | Load 6 Current | 0.00A |
| Controller Specifications | Load 7 Current | 0.00A | Load 8 Current | 0.00A |
| Rectifiers  2 | Load 9 Current | 0.00A | Load 10 Current | 0.00A |
| Converters  0 | Load 11 Current | 0.00A | Load 12 Current | 0.00A |
| System Specifications | Load 13 Current | 0.00A | Load 14 Current | 0.00A |
| Product Model  NSC3 | Load 15 Current | 0.00A | Load 16 Current | 0.00A |
| Serial Number  03130400103 | Load 17 Current | 0.00A | Load 18 Current | 0.00A |
| Hardware Version A01 | Load 19 Current | 0.00A | Load 20 Current | 0.00A |
| Software Version 0.01T05 | KWH1Day1 | 0.00kwh | KWH2Day1 | 0.00kwh |
| Configuration  1.00 | KWH3Day1 | 0.00kwh | KWH4Day1 | 0.00kwh |
| | KWH5Day1 | 0.00kwh | KWH6Day1 | 0.00kwh |
| | KWH7Day1 | 0.00kwh | KWH8Day1 | 0.00kwh |
| | KWH9Day1 | 0.00kwh | KWH10Day1 | 0.00kwh |
| | KWH11Day1 | 0.00kwh | KWH12Day1 | 0.00kwh |
| | KWH13Day1 | 0.00kwh | KWH14Day1 | 0.00kwh |
| | ⚠ All Alarms(4) ⚠ Observation(0) ⚠ Major(2) ⚠ Critical(2) | | | ☑ Auto Popup |

1500

COMPUTER SYSTEMS AND COMPUTER-IMPLEMENTED METHODS FOR WARNING USERS OF OVERLOAD CONDITIONS IN POWER DISTRIBUTION SYSTEMS

FIELD

The present disclosure relates to computer systems and computer-implemented methods for warning users of overload conditions in power distribution systems.

BACKGROUND

This section provides background information related to the present disclosure which is not necessarily prior art.

Computer systems may monitor and control power distribution units that provide power to various loads. The computer systems may communicate with sensors or other monitoring devices to determine overload conditions in the power distribution units. If such overload conditions exist, the computer systems may generate warnings and/or remove loads coupled to particular power distribution units to decrease overloading on those particular power distribution units.

SUMMARY

This section provides a general summary of the disclosure, and is not a comprehensive disclosure of its full scope or all of its features.

According to one aspect of the present disclosure, a computer-implemented method includes linking a plurality of load distribution points in a power distribution unit to a plurality of electrical loads in response to user input, receiving data indicative of one or more electrical parameters associated with the plurality of load distribution points, selecting a visual indicator from a group of indicators based on the one or more electrical parameters associated with the load distribution point for each of the plurality of load distribution points, and displaying the selected visual indicators for the plurality of load distribution points on a visual display for viewing by a user. Each of the electrical loads are electrically coupled to one or more of the plurality of load distribution points.

According to another aspect of the present disclosure, a computer system includes a computer having one or more processors, a memory coupled to the one or more processors, a visual display coupled to the one or more processors, and computer executable instructions stored in the memory and executable by the one or more processors. The computer executable instructions includes instructions for linking a plurality of load distribution points in a power distribution unit to a plurality of electrical loads in response to user input, receiving data indicative of one or more electrical parameters associated with the plurality of load distribution points, selecting a visual indicator from a group of indicators based on the one or more electrical parameters associated with the load distribution point for each of the plurality of load distribution points, and displaying the selected visual indicators for the plurality of load distribution points on the visual display for viewing by a user. Each of the electrical loads are electrically coupled to one or more of the plurality of load distribution points.

According to a further aspect of the present disclosure, a non-transitory computer readable medium including computer executable instructions executable by at least one processor of a computer system is provided. The computer executable instructions includes instructions for linking a plurality of load distribution points in a power distribution unit to a plurality of electrical loads in response to user input, receiving data indicative of one or more electrical parameters associated with the plurality of load distribution points, selecting a visual indicator from a group of indicators based on the one or more electrical parameters associated with the load distribution point for each of the plurality of load distribution points, and displaying the selected visual indicators for the plurality of load distribution points on a visual display for viewing by a user. Each of the electrical loads are electrically coupled to one or more of the plurality of load distribution points.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4 is a screen shot of a user interface including a settings menu having battery backup inputs according to another example embodiment.

FIG. 15 is a screen shot of a user interface including information related to the DC power distribution system of FIG. 9.

Corresponding reference numerals indicate corresponding parts or features throughout the several views of the drawings.

DETAILED DESCRIPTION

Figure 1:
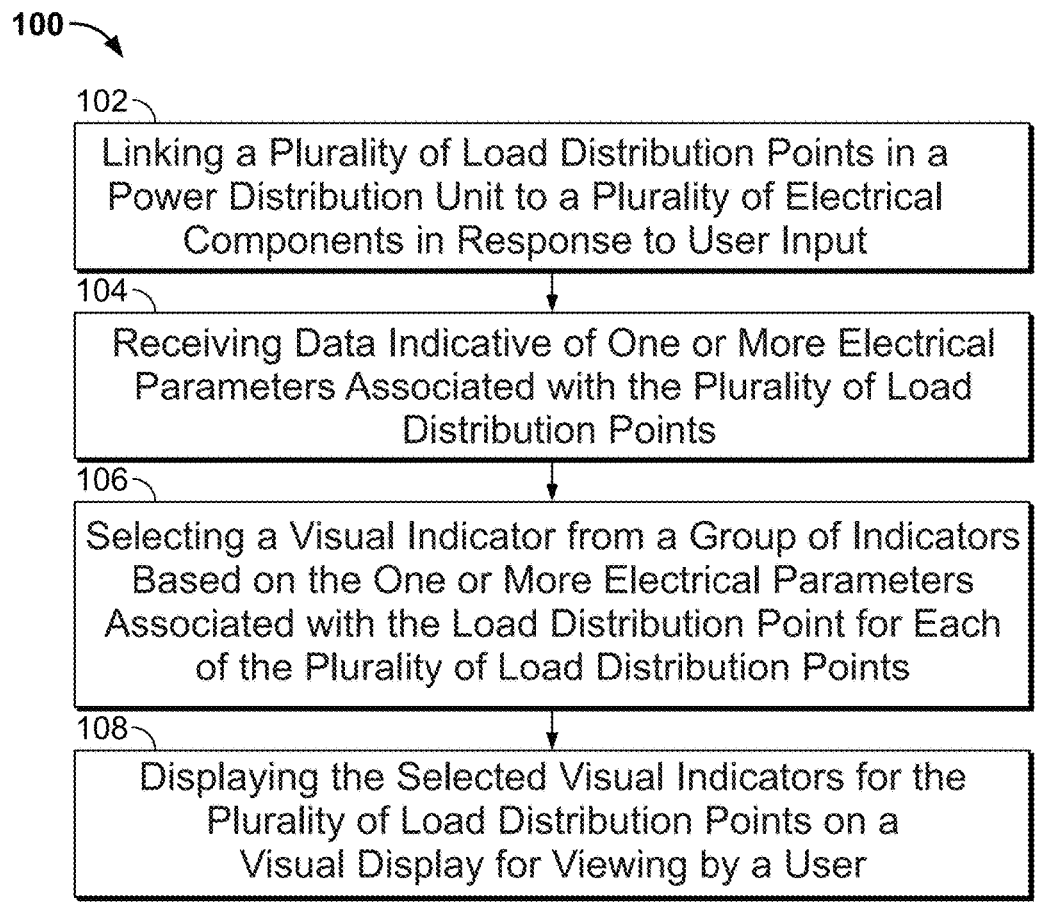
FIG. 1 is a flow diagram of a computer-implemented method according to one aspect of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A computer-implemented method according to one example embodiment of the present disclosure is illustrated in FIG. 1 and indicated generally by reference number 100. As shown in FIG. 1, the computer-implemented method 100 includes linking a plurality of load distribution points in a power distribution unit to a plurality of electrical loads in response to user input in step 102, receiving in step 104 data indicative of one or more electrical parameters associated with the plurality of load distribution points, selecting in step 106 a visual indicator from a group of indicators based on the one or more electrical parameters associated with the load distribution point for each of the plurality of load distribution points, and displaying in step 108 the selected visual indicators for the plurality of load distribution points on a visual display for viewing by a user. In the example method 100 of FIG. 1, each of the electrical loads are electrically coupled to one or more of the plurality of load distribution points.

By linking load distribution points to the electrical loads in response to user input, a map or another graphical display may be generated to correspond to load distribution points electrically coupled to electrical loads in a power distribution system. In this way, users may be able to view, track, etc. electrical parameters of the load distribution points electrically coupled to electrical loads via the generated map.

For example, by implementing one or more of the computer-implemented methods disclosed herein, early notifications of overload conditions, near overload conditions, etc. of load distribution points (e.g., circuit breakers, fuses, connection terminals without short circuit protection, etc.) electrically coupled to electrical loads may be provided. Therefore, based on the early notifications, one or more actions may be taken to address these conditions. For example, electrical loads may be disconnected from particular load distribution points to reduce load current, electrical loads may be moved to other load distribution points, lower rated load distribution points may be replaced with higher rated load distribution points, etc. Thus, by implementing the computer-implemented methods, systems including the load distribution points and the electrical loads may become more reliable due (at least in part) to the early notifications of overload conditions.

Additionally, the computer-implemented methods may assist in balancing loads in a system. For example, load distribution points may be monitored via the received data noted above. Depending on the received data, one or more electrical loads may be moved to other circuits to balance loads in the system.

The load distribution points in the power distribution unit may be linked to the electrical loads in different configurations in response to user input. For example, depending on the rated current of particular load distribution points (e.g., circuit breakers, etc.), current needed by particular electrical loads, etc., one or more load distribution points may be linked to one or more electrical loads. Thus, in some examples, one load distribution point may be linked to one electrical load, two or more load distribution points may be linked to one electrical load, one load distribution point may be linked to two or more electrical loads, etc. in response to user input.

The data indicative of the electrical parameters associated with the load distribution point(s) may be received (e.g., directly or indirectly) from one or more sensors associated with the load distribution points. For example, the sensors may sense the temperature of and/or adjacent the load distribution point, current passing through the load distribution point, a voltage across the load distribution point, etc. Therefore, the electrical parameters associated with the load distribution points may include current, voltage, temperature, etc.

In some examples, the sensors (e.g., Hall effect sensors, shunts, thermistors, etc.) may be existing sensors associated with the load distribution points in the power distribution unit. Thus, in such cases, no additional sensors may be needed to sense the electrical parameters in the power distribution unit, customer racks including one or more electrical loads, etc.

The visual indicator may be selected based on a comparison of the electrical parameters associated with a load distribution point with a threshold value. For example, a threshold value may be assigned for each load distribution point. In response to the electrical parameters exceeding the threshold value, a particular visual indicator may be selected and displayed as explained above.

The threshold value may be the same or different for each load distribution point. In some examples, the assigned threshold value may be fixed or variable (e.g., depending on the location, temperature, application, etc. of the load).

In some cases, the assigned threshold value may be based on a rated parameter (e.g., a rated current) for each load distribution point (e.g., a circuit breaker, etc.). For example, the threshold value may be about 80% of a rated current (e.g., 25 A) for one load distribution point and 80% of a rated current (e.g., 30 A) for another load distribution point. In other examples, the threshold value may be 80% for load distribution points having a rated current of 25 A and 75% for load distribution points having a rated current 30 A.

If desired, more than one visual indicator may be selected from the group of visual indicators. For example, one visual indicator may be selected (and displayed) when an electrical parameter associated with a load distribution point is below a threshold value while another visual indicator may be selected (and displayed) when the electrical parameter associated with the load distribution point is above the threshold value.

Additionally, multiple threshold values may be assigned for one or more load distribution points. In such cases, one visual indicator may be selected (and displayed) when an electrical parameter associated with a load distribution point is below one of the threshold values, another visual indicator may be selected (and displayed) when the electrical parameter is above that threshold value, and third visual indictor may be selected (and displayed) when the electrical parameter associated with the load distribution point is above another threshold value. For example, one threshold value may represent an overload condition while the other threshold value may represent a value below the overload condition. Thus, the user may be notified of when a particular load distribution point is not overloaded, is near (e.g., within a defined percentage, etc.) an overload condition, and/or is overloaded.

Other visual indicators may be employed to represent conditions associated with the electrical loads. For example, a visual indicator for one or more electrical loads may be selected (and displayed) from a group of indicators. This visual indicator may be based on the electrical parameters associated with a load distribution point linked to the electrical loads. Additionally, the visual indicator for the electrical loads and the visual indicator for the circuit load distribution points may be selected from the same or a different group of indicators.

The visual indicators for the electrical loads may be selected (and displayed) in a similar manner as described above with reference to the visual indicator for the load distribution points.

The load distribution points may be any suitable point in a power distribution unit associated with providing power to a load. For example, and as further explained below, the load distribution points may include circuit breakers as shown in the examples embodiments of FIGS. 4-15. Additionally and alternatively, other suitable load distribution points including, for example, fuses (e.g., electronic fuses, etc.), connection terminals with or without short circuit protection, etc. may be employed without departing from the scope of the disclosure.

One or more of the computer-implemented methods disclosed herein may be implemented as computer executable instructions which may be stored in a non-transitory computer readable medium. The computer executable instructions may be executable by one or more processors of a computer system.

Figure 2:
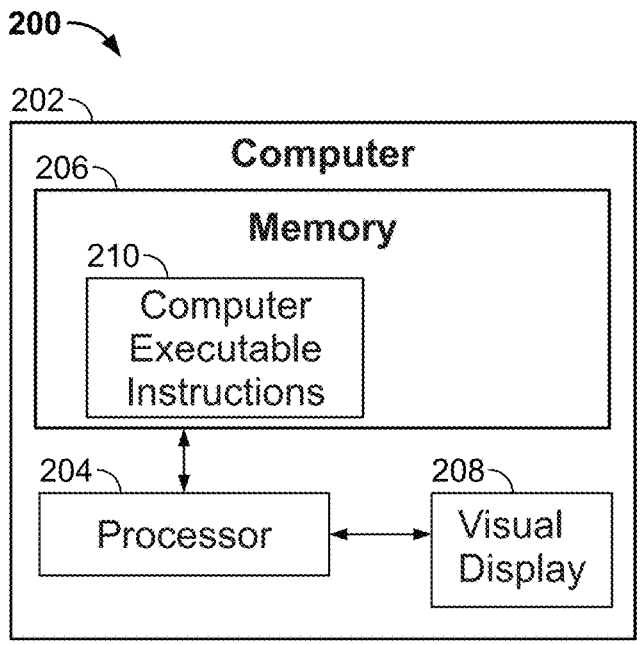
FIG. 2 is a block diagram of a computer system including memory, computer executable instructions, a processor, and a visual display according to another example embodiment.
Figure 3:
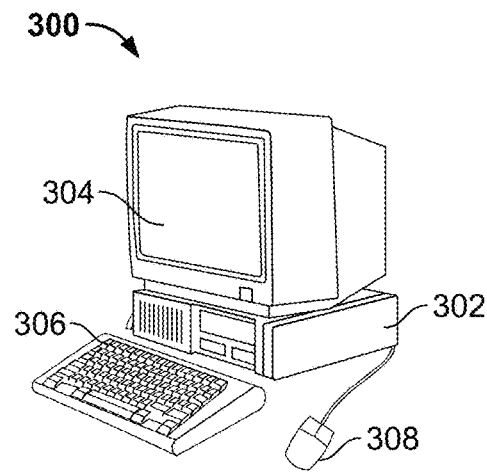
FIG. 3 is a block diagram of a computer including a visual display and various input devices according to yet another example embodiment.

The computer readable medium may be any suitable medium capable of being accessed by a computer system (e.g., computer systems 200, 300 of FIGS. 2 and 3, etc.). For example, the computer readable medium may include volatile memory, non-volatile memory, removable memory, non-removable media, RAM, ROM, EEPROM, flash memory, CD-ROM, DVD, optical disk storage, magnetic cassettes, magnetic tape, magnetic disk storage, etc.

FIG. 2 illustrates one example computer system 200 including a computer 202 having a processor 204, memory 206 coupled to the processor 204, a visual display 208 coupled to the processor 204, and computer executable instructions 210 stored in the memory 206. The computer executable instructions 210 include instructions operable to cause the processor 204 to perform one or more of the computer-implemented methods disclosed herein.

The computer executable instructions 210 (e.g., program modules, etc.) may be executed by the processor 204 of the computer 202. Program modules may include routines, programs, objects, components, data structures, etc., that may perform particular tasks or implement particular abstract data types. The present disclosure may include a distributed computing environment where some processes may be performed by remote processing devices that may be linked through a communications network. Program modules may be located in local and/or remote computer storage mediums including memory storage devices.

The computer system 200 may be implemented using a single processor, multiple processors on a single system, multiple processors across systems that may be in a local or distributed system, etc. A system bus may be used to couple components of the computer system 200 to the processor 204, such as the memory 206. The system bus may be any suitable bus architecture such as a memory bus, memory controller, peripheral bus, local bus, Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Mezzanine bus, etc.

The memory 206 may be memory located on a single computer, a server, shared between multiple systems, etc. The memory 206 may be located within the same system as one or more of the processors 204 (including, e.g., onboard memory in the processors), or may be located externally.

The memory 206 may include volatile memory, nonvolatile memory, ROM, RAM, one or more hard disks, magnetic disk drives, optical disk drives, removable memory, non-removable memory, magnetic tape cassettes, flash memory cards, CD-ROM, DVDs, cloud storage, etc.

In addition to the memory 206, the computer system 200 may include and/or may be configured to receive one or more other non-transitory computer readable mediums as explained above. For example, the computer system 200 may include a DVD player or the like to read DC-ROMs, DVDs, etc., USB port(s) or the like to receive flash memory, etc.

The computer executable instructions 210 may be stored in any suitable location in the memory 206 and may or may not be stored in the same memory. The instructions 210 may be stored in memory 206 on a single computer, a server, may be shared between multiple systems, etc. The memory 206 and/or non-transitory computer readable medium may store the instructions 210, operating systems, application programs, other program modules, program data, etc.

The computer system 200 may operate in a networked environment using logical connections to one or more remote computers, such as a personal computer, server, router, network computer, etc. The logical connections may include a wired network and/or wireless network. The logical connections may include a local area network (LAN) (e.g., Intranet, etc.), a wide area network (WAN) (e.g., the Internet, etc.), etc. When used in a LAN working environment, the computer system 200 may be connected to the LAN through a network interface, adapter, etc. When used in a WAN network, the computer system may be connected to the WAN through a modem, wireless network adapter, etc.

FIG. 3 illustrates another example computer system 300 including an enclosure 302 storing one or more processors and memory coupled to the processor(s), and a visual display 304, a keyboard 306, and a mouse 308, all of which are coupled to the processor(s) within the enclosure 302. The memory stores computer executable instructions operable to cause the processor to perform one or more of the computer-implemented methods disclosed herein. The processor(s), memory, and computer executable instructions may be similar to the processor 204, memory 206, and computer executable instructions 210 of FIG. 2.

In the example of FIG. 3, users may enter input commands and/or information into the computer system 300 via the visual display 304 (e.g., a touch screen for receiving user inputs), the keyboard 306, the mouse 308, and/or other input devices (not shown) including, for example, pointing devices, trackballs, touch pads, microphones, joysticks, game pads, scanners, etc. Users may receive information via the visual display 304 and/or other output devices (not shown) including, for example, speakers, printers, etc.

It should be understood that the computer systems 200, 300 are examples of a suitable computer system and are not intended to suggest any limitation as to the scope of use or functionality of the present disclosure. The computer systems 200, 300 should not be interpreted as having any dependency or requirement relating to any component or combination of components illustrated or not illustrated in FIGS. 2 and/or 3. The present disclosure may be operational with any suitable general purpose or special purpose computing system environment or configuration. For example, the computer system 200 and/or the computer 300 may be implemented using personal computers, laptop computers, server computers, network computers, minicomputers, mainframe computers, hand-held devices, multiprocessor systems, microprocessor-based systems, set top boxes, programmable consumer electronics, cloud platforms, distributed computing environments that include any of the above systems or devices, etc.

The visual display 208 of FIG. 2 and/or the visual display 304 of FIG. 3 may display one or more example user interfaces which may include the selected visual indicators as explained above in addition to other features including those disclosed herein. FIGS. 4-15 illustrate various screen shots of example user interfaces provided to a visual display (e.g., the visual display 208, 304) which allows a user to input commands and/or information via an input device (e.g., the keyboard 306, the mouse 308, etc.), and/or to view visual indicators, data, etc. related to a DC power distribution system. For example, the user interfaces may display information related to one or more circuit breakers, electrical loads (e.g., telecommunication loads, datacom loads, etc.) electrically coupled to the circuit breakers, etc. of the DC power distribution system.

The user interfaces of FIGS. 4-15 may be provided based on one or more computer executable instructions including those explained herein. Additionally, the user interfaces may include components representing electrical loads and/or circuit breakers as explained above. The user interfaces may include graphical user interfaces (GUI), text-based interfaces, etc. In some examples, the user interfaces may accessed via web-based application programs, etc.

FIG. 4 illustrates an example user interface 400 including a "Home" menu, a "Settings" menu, a "History Log" menu, a "System Inventory" menu, an "Advanced Settings" menu, and an "Install Wizard" menu. Additionally, the user interface 400 includes information related to the DC power distribution system including, for example, the number of rectifiers, converters, etc. in the system, specific system specifications (e.g., product numbers, software versions, etc.). These various menus and/or information related to the DC power distribution system may also be displayed in other user interfaces of FIGS. 5-15 further explained below.

The settings menu includes numerous tabs (e.g., "Charge," "Rectifiers," "Individual Load Mgmt," "Site Power Consumption Map," etc.) to allow the user to view, alter, etc. specific setting related to that particular tab. In the particular example of FIG. 4, the "Charge" tab is selected. In this tab, numerous settings (e.g., a battery type, rated capacity, voltages, current limits, etc.) related to one or more backup batteries within the DC power distribution system may be viewed, altered, etc.

Figure 5:
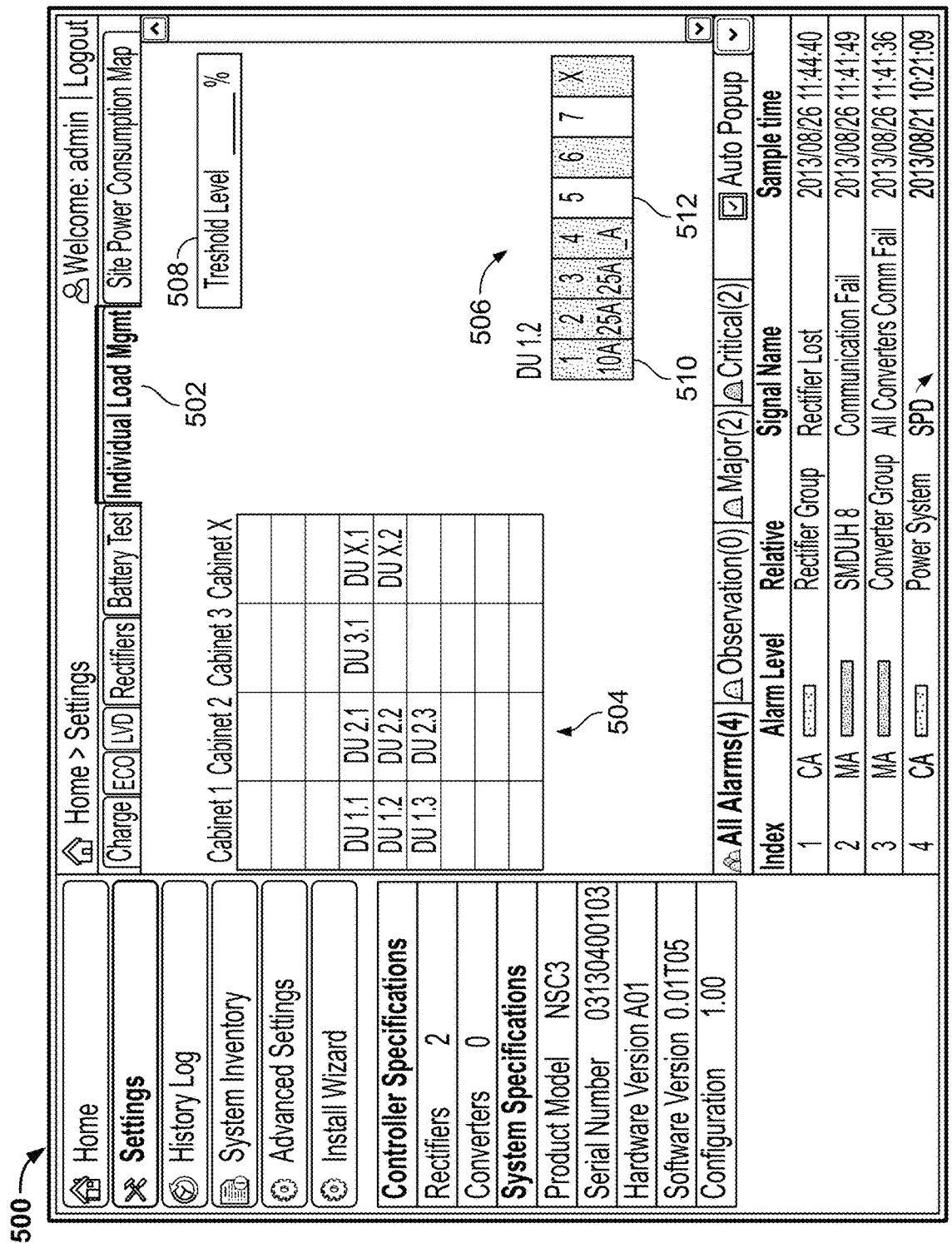
FIG. 5 is a screen shot of a user interface including the settings menu having load management options according to yet another example embodiment.

FIG. 5 illustrates a user interface 500 after the user selects the "Individual Load Mgmt" tab 502 of the settings menu. As shown in FIG. 5, the user interface 500 includes a table 504 of cabinets (e.g., Cabinet 1, Cabinet 2, etc.) corresponding to cabinets of the DC power distribution system. Each cabinet of the user interface 500 includes distribution units (DU 1.1, DU 1.2, etc.). If the user selects a particular distribution unit (e.g., DU 1.2), the user interface 500 displays a table 506 of circuit breakers (e.g., indicated by reference number 510) and/or open circuit breaker positions (e.g., indicated by reference number 512) within that distribution unit.

As shown in FIG. 5, the user interface 500 also includes a box 508 for receiving a threshold level percentage. The threshold level percentage may be used to set a threshold value for each circuit breaker as explained above.

The user may enter a rated current value (e.g., 10 A, 25 A, etc.) for some or all circuit breakers of table 506 and the threshold level percentage of box 50 via an input device as explained above. For example, the rated current values and/or the threshold level percentage may be entered via a keyboard, a mouse selecting from a drop down menu, etc.

After entered, the rated current values and the threshold level percentage may be stored in memory as explained above.

Figure 6:
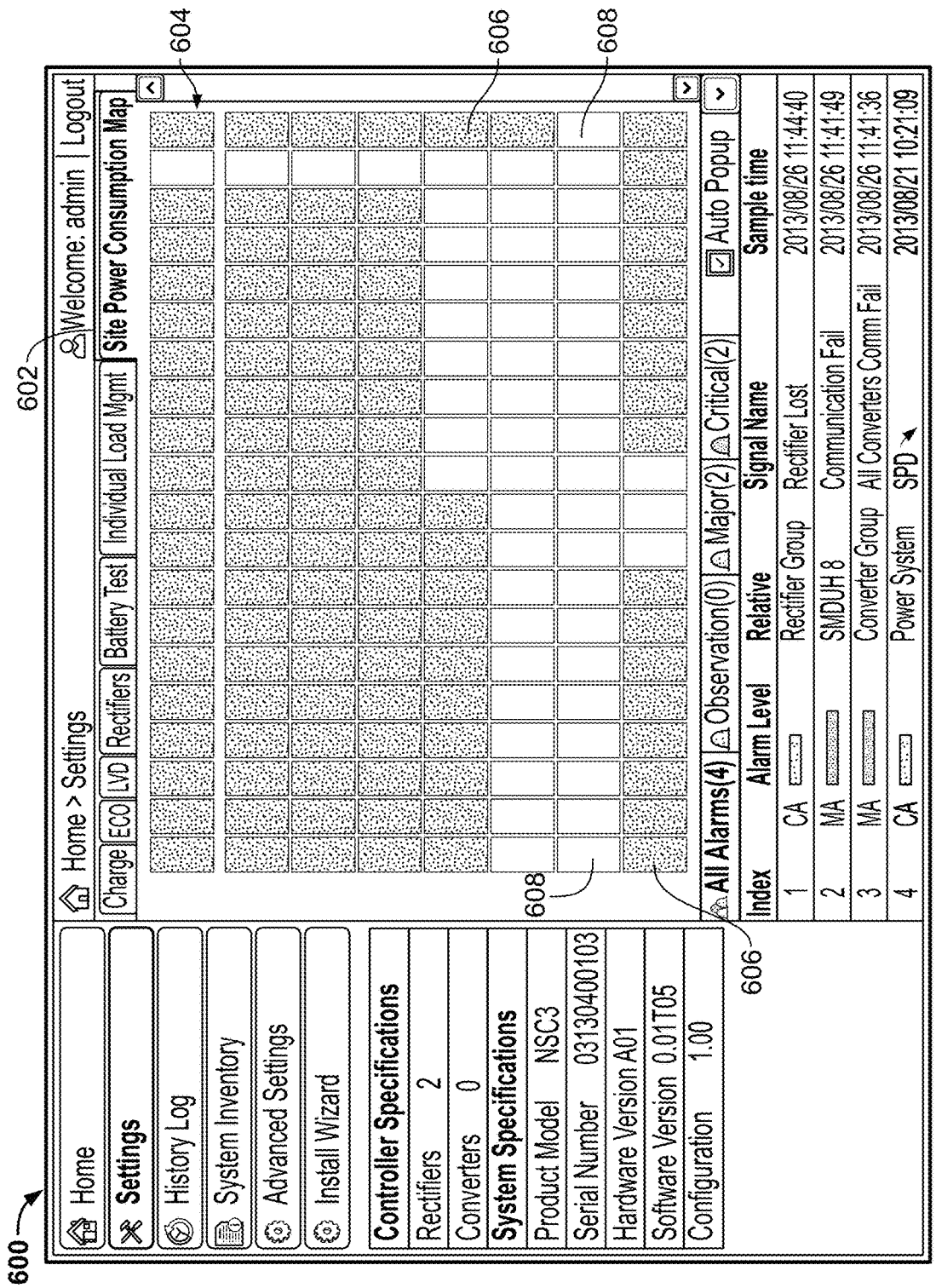
FIG. 6 is a screen shot of a user interface including the settings menu having various load positions according to another example embodiment.

FIG. 6 illustrates an example user interface 600 after the user selects the "Site Power Consumption Map" tab 602 of the settings menu. As shown in FIG. 6, the user interface 600 includes a map 604 of various load positions corresponding to cabinets having one or more electrical loads as disclosed herein. Some of the load positions (e.g., indicated by reference number 606) may include one or more loads while other load positions (e.g., indicated by reference number 608) may be open. If desired, the user may select a particular load position and input information regarding the corresponding cabinet, change the status of the particular load position (e.g., whether a load position includes a load or not), etc.

Figure 7:
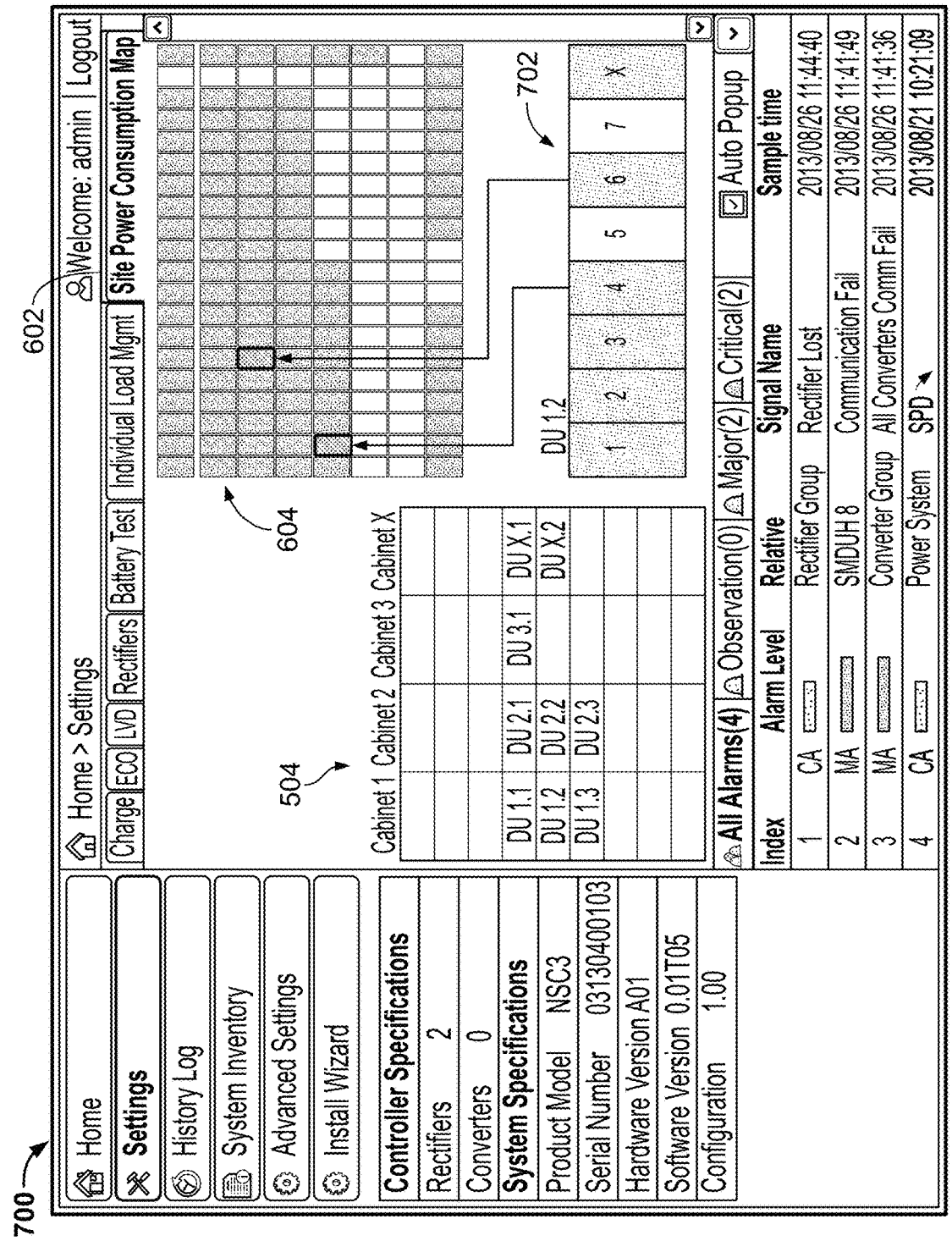
FIG. 7 is a screen shot of a user interface linking circuit breakers to load positions having electrical loads according to yet another example embodiment.
Figure 8:
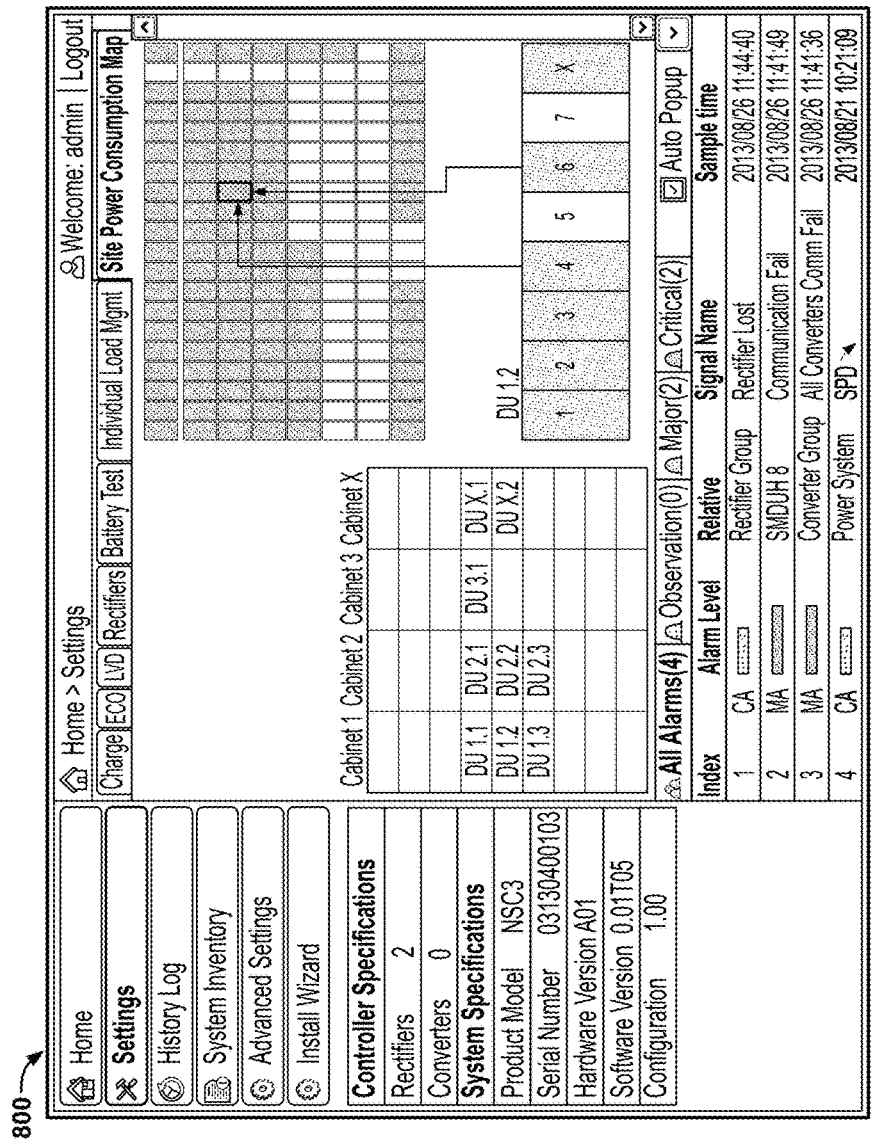
FIG. 8 is a screen shot of a user interface linking circuit breakers to a load position having electrical loads according to another example embodiment.

FIG. 7 illustrates a user interface 700 including the table 504 of FIG. 5, the map 604 of FIG. 6, and a table 702 which is similar to the table 506 of FIG. 5 but does not include the rated current value for each circuit breaker. As shown in FIG. 7, the user may link one or more circuit breakers to a load position including an electrical load. The linked circuit breaker(s) and load position correspond to circuit breaker(s) in the DC power distribution system electrically coupled to electrical loads as explained above.

In the particular example of FIG. 7, circuit breaker 4 is linked to load position "5:2" (e.g., the load positions at row 5, column 2) while circuit breaker 5 is linked to load position "6:3". Alternatively, two or more circuit breakers may be linked to one load position (e.g., as shown in user interface 800 of FIG. 8), one circuit breaker may be linked to two or more load positions, etc.

The user may link the circuit breakers to the load positions by employing a drag and drop process (e.g., employing the mouse 308 of FIG. 3) or another suitable process.

Figure 9:
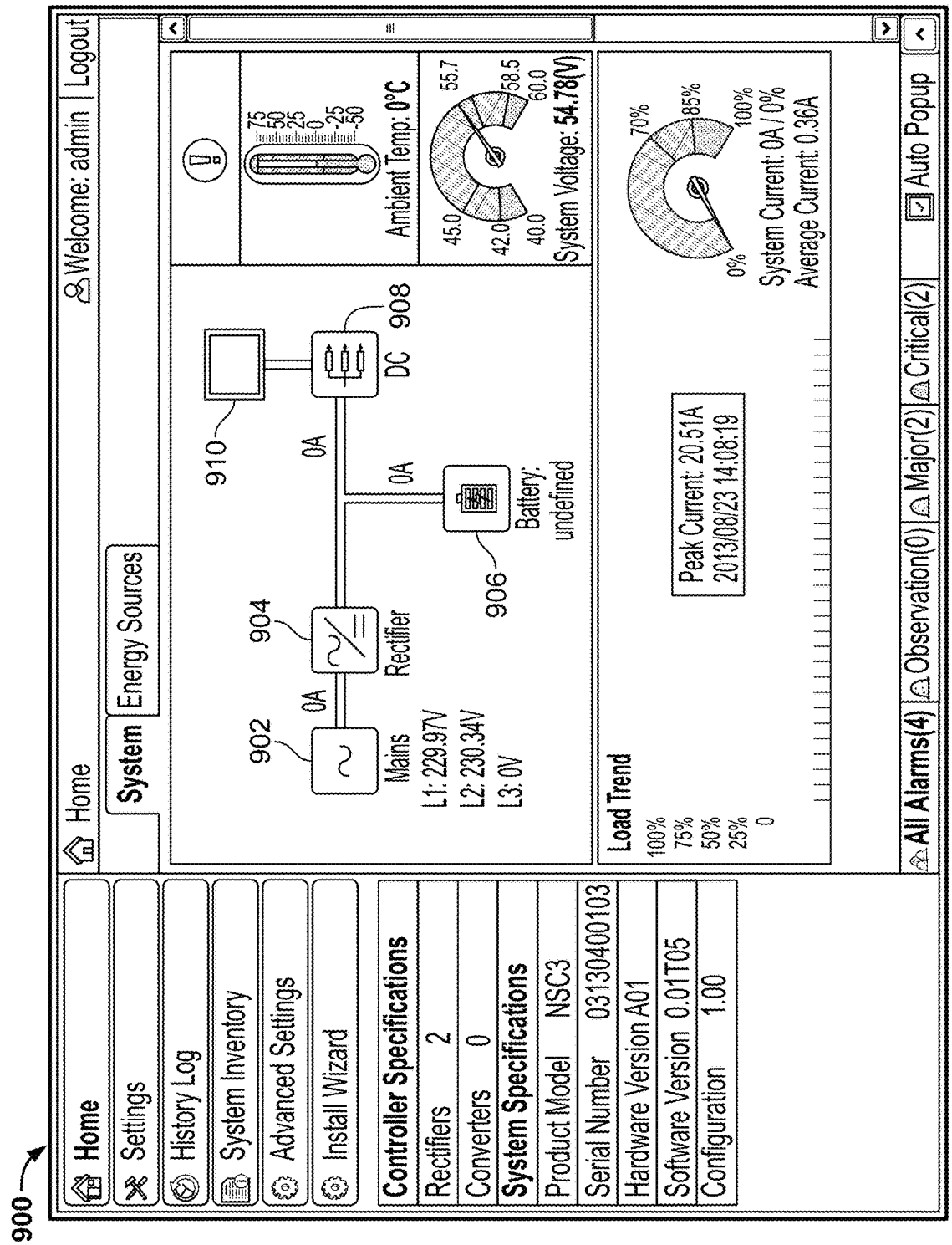
FIG. 9 is a screen shot of a user interface of a home menu including loads of a DC power distribution system according to yet another example embodiment.

FIG. 9 illustrates an example user interface 900 displaying the "Home" menu having a "System" tab and an "Energy Sources" tab. In the particular example of FIG. 9, the "System" tab is selected for viewing. The "System" tab allows the user to view modules representing components of the DC power distribution system. For example, modules 902, 904, 906, 908, 910 represent a mains supply, rectifier(s) for converting AC power from the mains supply to DC power, a battery unit (e.g., a battery backup unit including a battery, etc.), a DC distribution bus, and a load, respectively. The modules 902, 904, 906, 908, 910 are selectable to allow the user to view information regarding, for example, the rectifiers, the DC distribution bus, the load, etc.

Additionally, the user interface 900 of FIG. 9 may display other electrical parameters of the DC power distribution system. For example and as shown in FIG. 9, the user interface 900 displays AC line voltages of the mains supply, ambient temperature, a system voltage, a system current, a peak current, an average current, and a load trend (e.g., a graphical representation of a load current varying over time).

Figure 10:
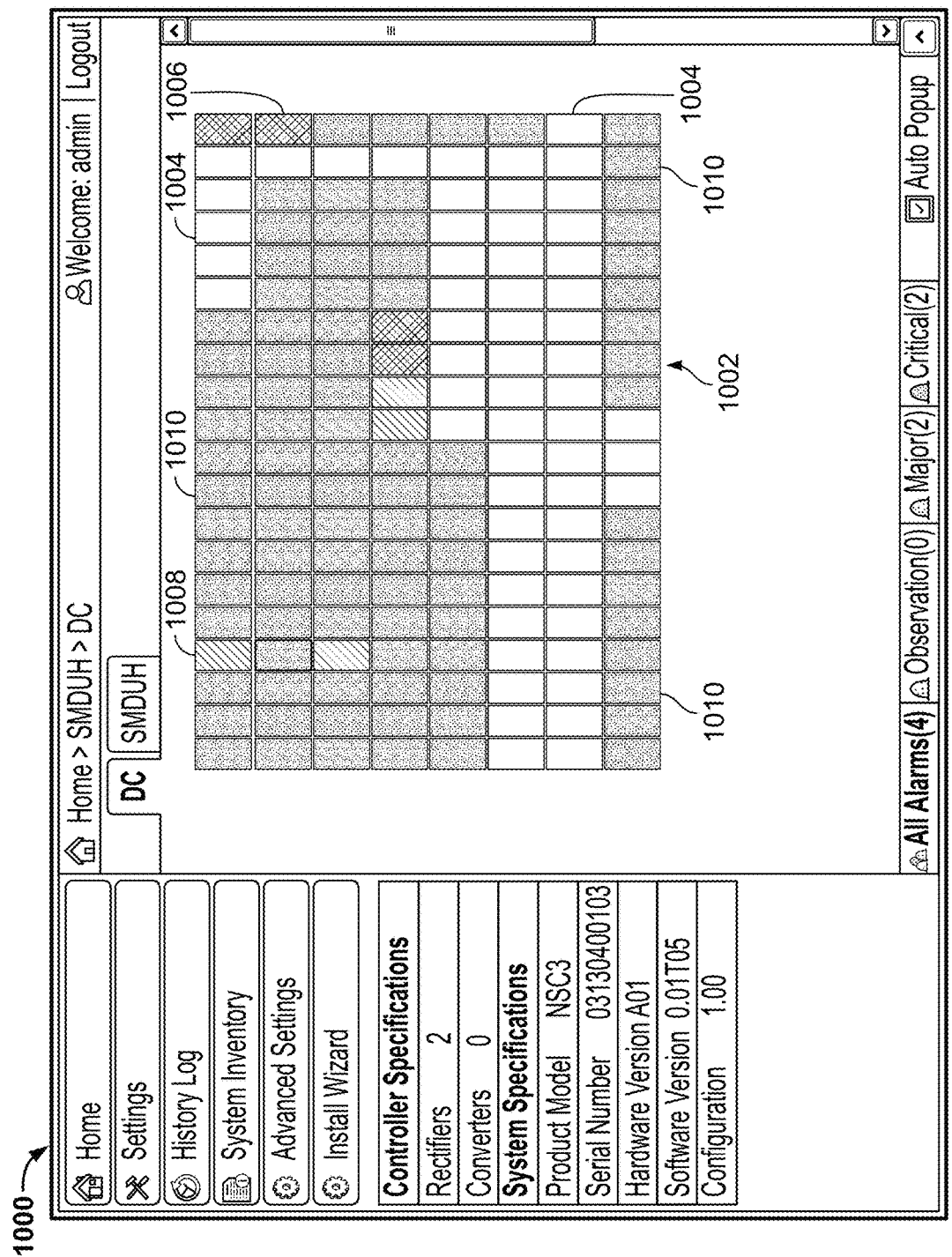
FIG. 10 is a screen shot of a user interface including a map of various load positions having electrical loads according to another example embodiment.

If the user selects the module 910 (representing a load) of FIG. 9, a map representing an overview of the load(s) is viewable. For example, FIG. 10 illustrates a user interface 1000 including a map 1002 corresponding to the various load positions linked to particular circuit breakers as explained above with reference to FIGS. 7 and 8.

One or more visual indicators may be employed to indicate specific information about each load position. In the example of FIG. 10, visual indicators 1004 represent open load positions, visual indicators 1006 represent overloaded load positions, visual indicators 1008 represent near overloaded load positions, and visual indicators 1010 represent load positions under normal conditions. In some embodiments and as further explained below, the visual indicators 1006, 1008, 1010 may include one or more colors representing a particular condition (e.g., overloaded, etc.) of the load position.

The visual indicators 1006, 1008, 1010 may be selected (and displayed) based on received data from electrical parameter(s) associated with linked circuit breakers of the DC power distribution system and one or more threshold values for the linked circuit breakers. For example, some or all of the visual indicators 1006, 1008, 1010 may be selected based on a comparison between power consumption of a load position and one or more threshold values. In some cases, the threshold value may be variable depending on a location of the load, a particular application of the load, etc.

Figure 11:
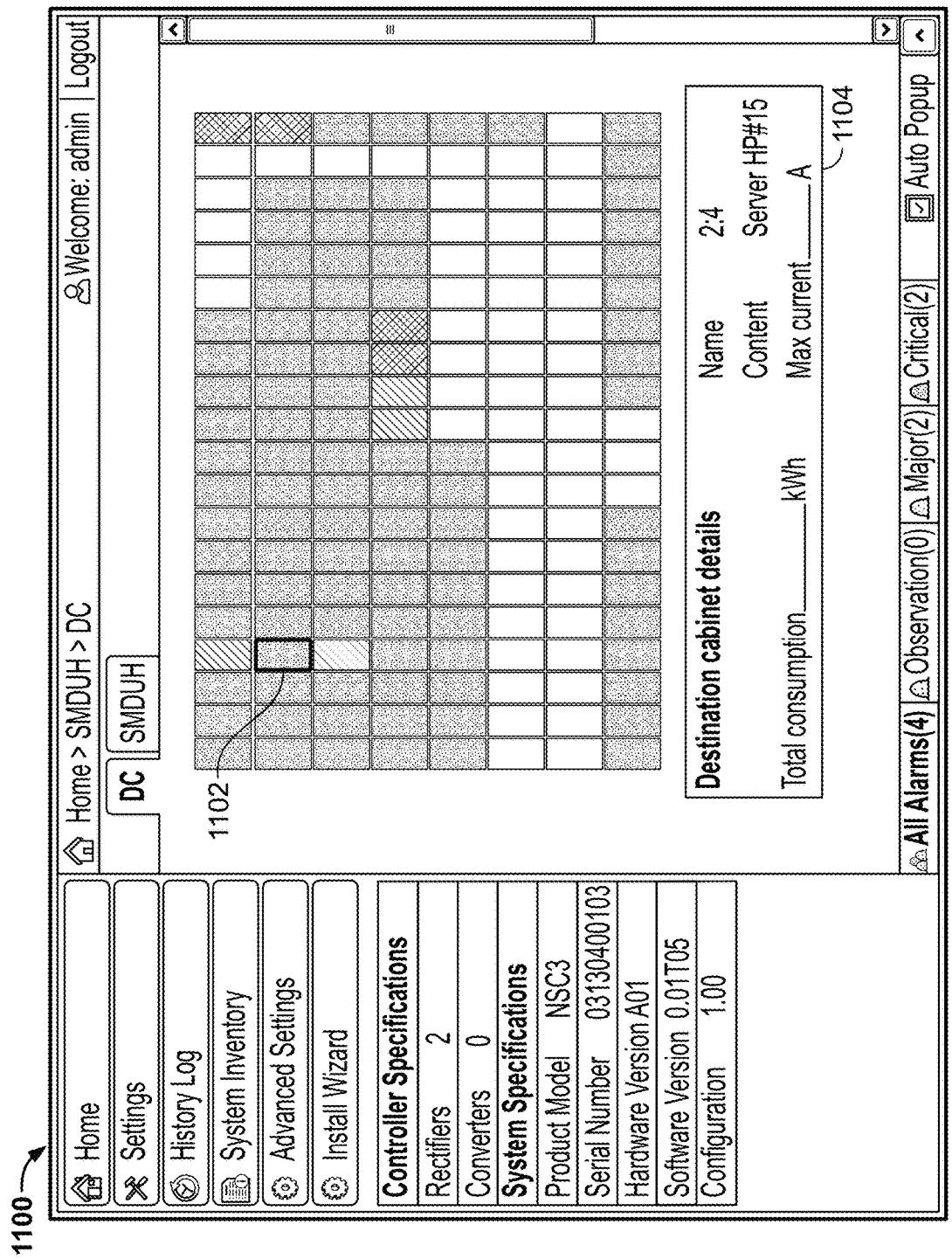
FIG. 11 is a screen shot of a user interface including the map of FIG. 10 having one load position selected.

The user may select a particular load position to access information about that load position. For example, FIG. 11 illustrates a user interface 1100 including a selected load position 1102 and a block 1104 including information about the selected load position 1102. This information may be based on a sensed current associated with the circuit breaker(s) electrically coupled to the electrical load(s).

The information presented in the block 1104 of FIG. 11 includes a name of the load position (e.g., "2:4" representing the selected load position at row 2, column 4 of the map 1002), content (e.g., "Server HP#15" or another description of the load position entered by the user), maximum current based on all installed circuit breakers, and total consumption of power accumulated over a period of time (e.g., a day, a week, a month, etc.). For example, the maximum current may be 300 A and the total consumption may be the power accumulated over a day. Additionally, although not shown in FIG. 11, the information may also include, for example, maximum power (e.g., 16 kW, etc.), total current used, peak current for a period of time (e.g., a week, a month, etc.), etc.

Figure 12:
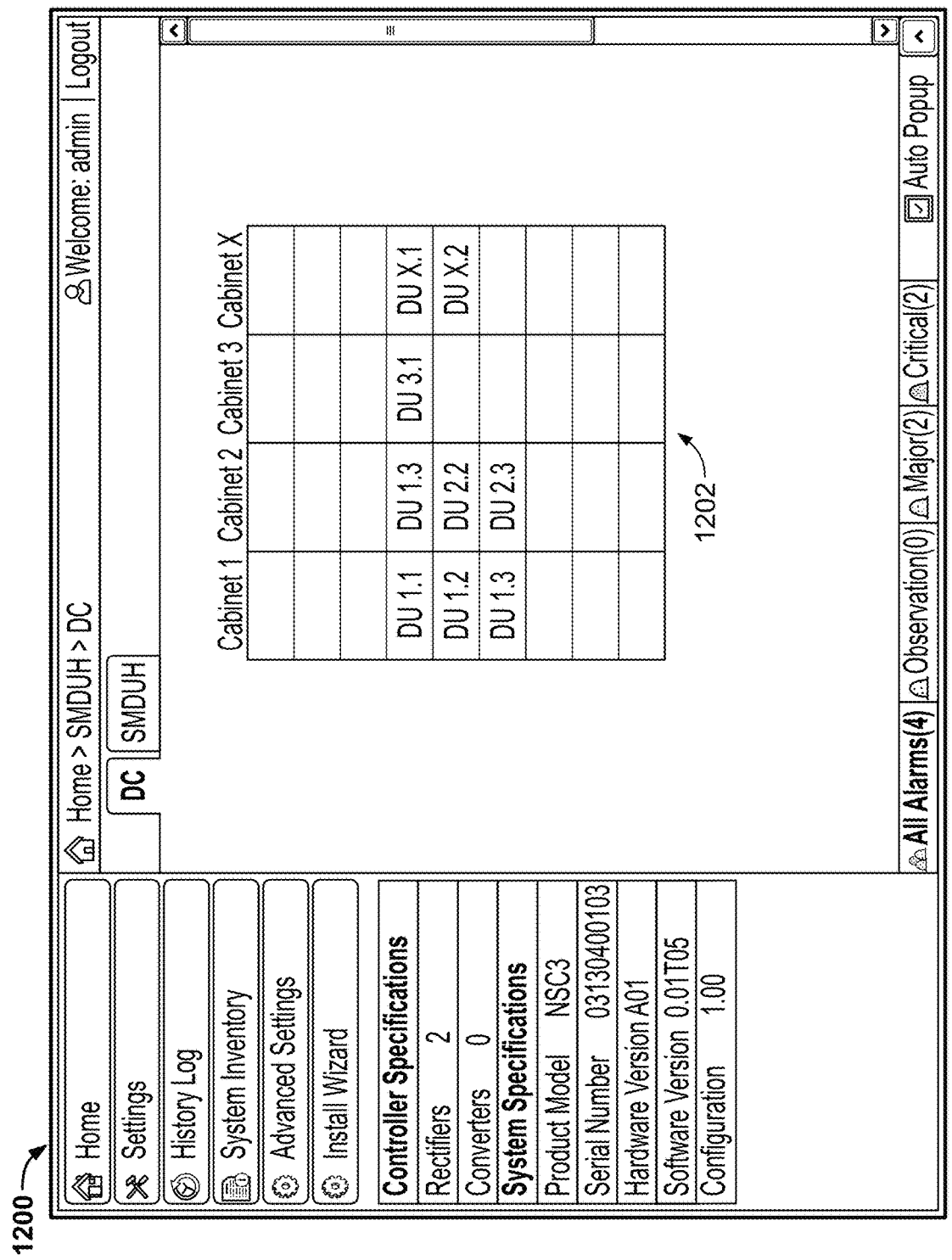
FIG. 12 is a screen shot of a user interface including cabinets including distribution units of the DC power distribution system of FIG. 9.

If the user selects the module 908 (representing the DC distribution bus of FIG. 9), information about particular cabinets including circuit breakers linked to load positions (e.g., the electrical loads) is displayed. For example, FIG. 12 illustrates a user interface 1200 including a table 1202 corresponding to the cabinets having distribution units (DU 1.1, DU 1.2, etc.) as explained above. Each distribution unit includes circuit breakers linked to various load positions as explained above with reference to FIGS. 7 and 8.

Figure 13:
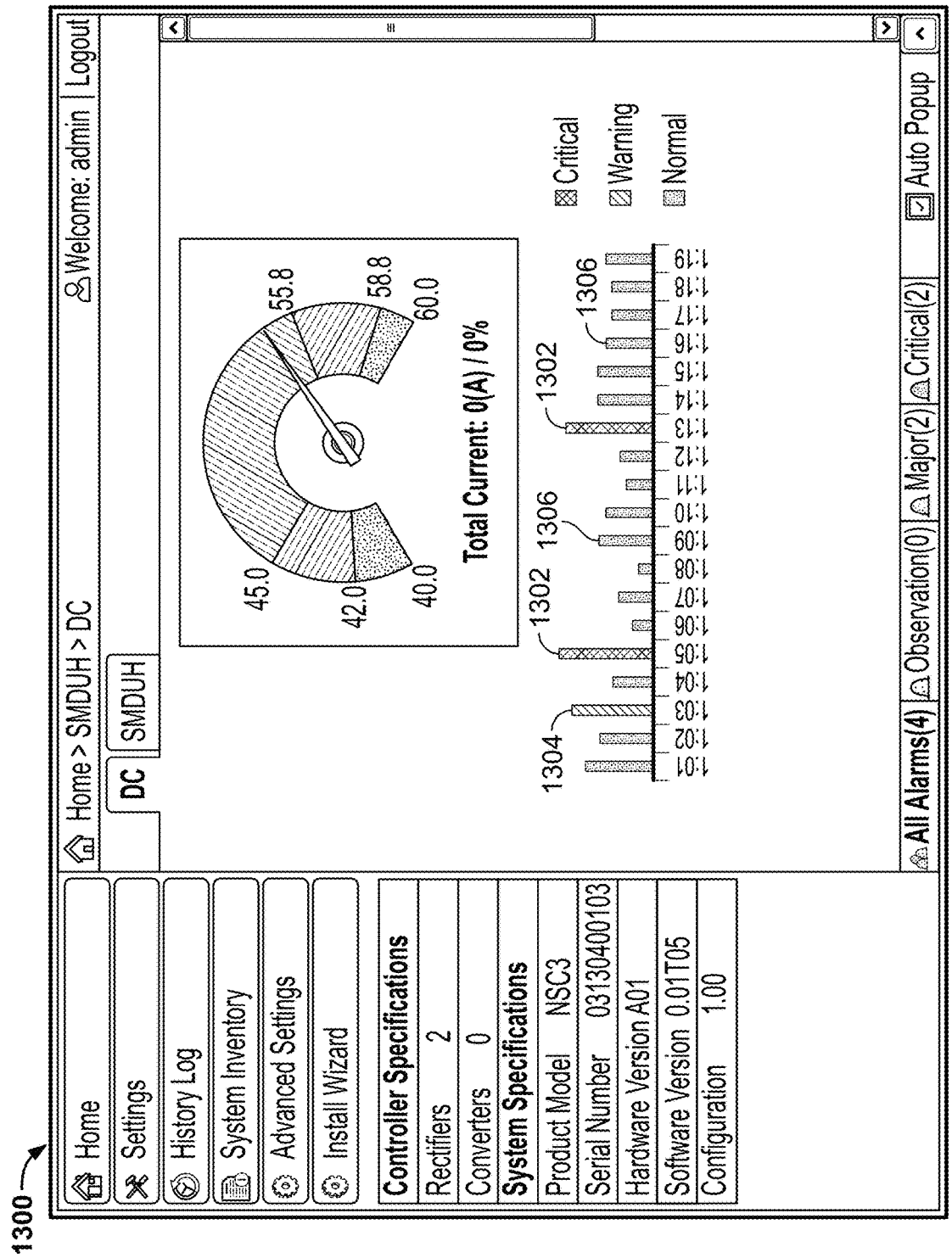
FIG. 13 is a screen shot of a user interface including one selected distribution unit of FIG. 12.

Each distribution unit of FIG. 12 is selectable to allow the user to view information about circuit breakers within that particular distribution unit. FIG. 13 illustrates a user interface 1300 including each circuit breaker (e.g., 1:01, 1:02, 1:03, etc.) within the selected DU 1.2 of FIG. 12, and information related to the selected DU 1.2 and circuit breakers. The information related to the selected DU may include, for example, an output current of the selected DU, a percentage representing the ratio of the output current of the selected DU and the DU's rated current, etc. For example, if the output current of the selected DU is 300 A and the DU's rated current is 500 A, the user interface 1300 would display "Total Current: 300 (A)/60%.

The information related to the circuit breakers may include visual indicators to indicate overload conditions, near overload conditions, etc. For example, visual indicators 1302 of FIG. 13 represents a "Critical" condition in which a circuit breaker (e.g., circuit breakers 1:05, 1:13) is overloaded, visual indicators 1304 represents a "Warning" condition in which a circuit breaker (e.g., circuit breaker 1:03) is nearing an overloaded condition, and visual indicators 1306 represents a "Normal" condition in which a circuit breaker (e.g., circuit breakers 1:01-02, 1:04, 1:06-12 and 1:14-19) is under normal operating conditions. Additionally and as shown in FIG. 13, the visual indicators may include a bar chart representing the current level of each circuit breaker relative to the a threshold value. As such, the user may receive a warning of overloaded conditions, early notifications of near overload conditions, etc.

Figure 14:
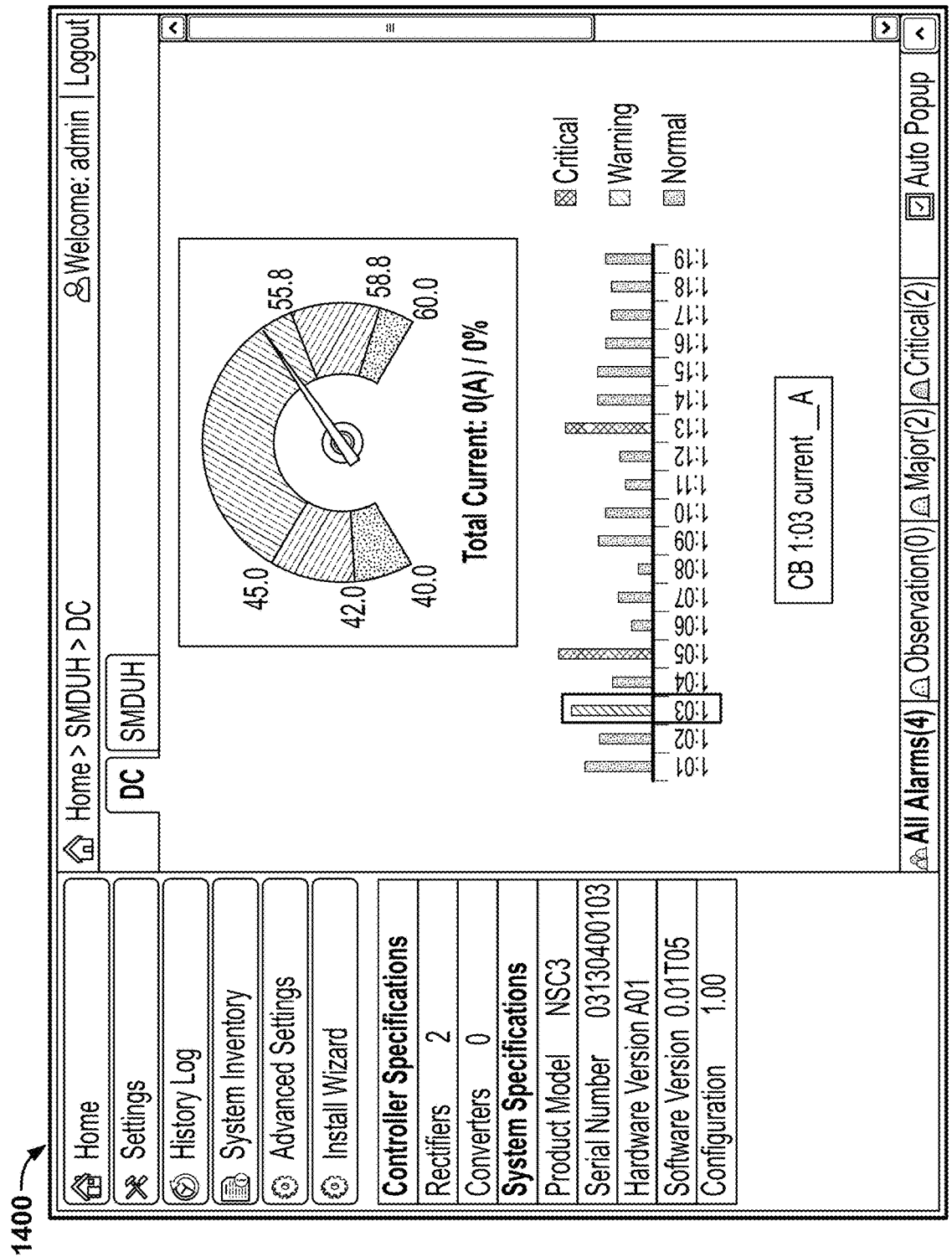
FIG. 14 is a screen shot of a user interface including information related to one selected circuit breaker of FIG. 13.

Each circuit breaker of FIG. 13 is selectable to allow the user to view the amount of current passing through a particular circuit breaker. FIG. 14 illustrates a user interface 1400 displaying an output current of the selected circuit breaker 1:03 of FIG. 13 having a "Warning" condition. For example, the output current of the selected circuit breaker 1:03 displayed by the user interface may be 40 A.

FIG. 15 illustrates a user interface 1500 displaying current for various loads (e.g., Load 1, Load 2, etc.) of a cabinet and the total amount of energy being used by each load over a particular day (e.g., KWH1 Day1, KWH2Day1, etc.). The various loads may correspond to one or more electrical loads disclosed herein.

Although the various user interfaces of FIGS. 4-15 include specific layouts of inputs and outputs (e.g., visual indicators, electrical parameters, etc.), etc., other layouts and/or configurations may be employed without departing from the present disclosure. For example, the user interfaces may display information (e.g., current, consumption, etc.), provide visual indicators, etc. for a combination of circuit breakers.

The visual indicators disclosed herein may include color, one or more shapes, graphical representation (e.g., bar charts, pie charts, etc.), etc. For example, a red visual indicator may represent an overloaded condition, a yellow visual indicator may represent a near overload condition, and a green visual indicator may represent normal operation. Additionally, the visual indicators may change between different colors (e.g., flashing) to notify users of particular conditions. The frequency of the color change may be constant or variable. The frequency may vary based on, for example, a current condition (e.g., overloaded, near overload, etc.), how close a near overload condition comes to an overloaded condition, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A computer-implemented method comprising:
in response to user input, linking a plurality of load distribution points in a power distribution unit to a plurality of electrical loads, wherein each of the electrical loads are electrically coupled to one or more of the plurality of load distribution points;
receiving data indicative of one or more electrical parameters associated with the plurality of load distribution points;
for each of the plurality of load distribution points, selecting a visual indicator from a group of indicators based on the one or more electrical parameters associated with the load distribution point; and
displaying the selected visual indicators for the plurality of load distribution points on a visual display for viewing by a user.

2. The computer-implemented method of claim 1 further comprising assigning a threshold value for each load distribution point of the plurality of load distribution points and wherein selecting includes selecting the visual indicator from the group of indicators in response to an electrical parameter of said one or more electrical parameters being above a threshold value.

3. The computer-implemented method of claim 2 wherein the threshold value for said each load distribution point is based on a percentage of a rated current for said each load distribution point.

4. The computer-implemented method of claim 3 wherein the threshold value for said each load distribution point is the same.

5. The computer-implemented method of claim 2 wherein the group of indicators includes at least a first visual indicator and a second visual indicator different than the first visual indicator, wherein selecting includes selecting the first visual indicator in response to the one or more electrical parameters associated with the load distribution point being below the threshold value and selecting the second visual indicator in response to the one or more electrical parameters associated with the load distribution point being above the threshold value, and wherein displaying includes displaying the selected first visual indicator and the selected second visual indicator on the visual display for viewing by a user.

6. The computer-implemented method of claim 1 wherein the one or more electrical parameters associated with the load distribution point includes at least one of a current and a voltage.

7. The computer-implemented method of claim 1 wherein the group of indicators is a first group of indicators, the method further comprising:
for each of the plurality of electrical loads, selecting a visual indicator from a second group of indicators based on the one or more electrical parameters associated with the load distribution point; and
displaying the selected visual indicators for the plurality of electrical loads on the visual display for viewing by a user.

8. The computer-implemented method of claim 1 wherein linking includes linking two or more of the plurality of load distribution points in the power distribution unit to one electrical load of the plurality of electrical loads.

9. The computer-implemented method of claim 1 wherein the plurality of load distribution points include at least one of a circuit breaker, a connection terminal, and a fuse.

10. A computer system comprising:
a computer having one or more processors, a memory coupled to the one or more processors, a visual display coupled to the one or more processors, and computer executable instructions stored in the memory and executable by the one or more processors, the computer executable instructions including instructions for linking a plurality of load distribution points in a power distribution unit to a plurality of electrical loads in response to user input, each of the electrical loads being electrically coupled to one or more of the plurality of load distribution points, receiving data indicative of one or more electrical parameters associated with the plurality of load distribution points, selecting a visual indicator from a group of indicators based on the one or more electrical parameters associated with the load distribution point for each of the plurality of load distribution points, and displaying the selected visual indicators for the plurality of load distribution points on the visual display for viewing by a user.

11. The computer system of claim 10 wherein linking includes linking two or more of the plurality of load distribution points in the power distribution unit to one electrical load of the plurality of electrical loads.

12. The computer system of claim 10 wherein the computer executable instructions further include instructions for assigning a threshold value for each load distribution point of the plurality of load distribution points and wherein selecting includes selecting the visual indicator from the group of indicators in response to an electrical parameter of said one or more electrical parameters being above a threshold value.

13. The computer system of claim 12 wherein the threshold value for said each load distribution point is the same.

14. The computer system of claim 12 wherein the memory is configured to store a rated current value of said each load distribution point and wherein the threshold value for said each load distribution point is based on a percentage of the rated current for said each load distribution point.

15. The computer system of claim 14 wherein the group of indicators includes at least a first visual indicator and a second visual indicator different than the first visual indicator, wherein selecting includes selecting the first visual indicator in response to the one or more electrical parameters associated with the load distribution point being below the threshold value and selecting the second visual indicator in response to the one or more electrical parameters associated with the load distribution point being above the threshold value, and wherein displaying includes displaying the selected first visual indicator and the selected second visual indicator on the visual display for viewing by a user.

16. The computer system of claim 10 wherein the group of indicators is a first group of indicators and wherein the computer executable instructions further include instructions for selecting a visual indicator from a second group of indicators based on the one or more electrical parameters associated with the load distribution point for each of the plurality of electrical loads, and displaying the selected visual indicators for the plurality of electrical loads on the visual display for viewing by a user.

17. The computer system of claim 10 wherein the one or more electrical parameters associated with the load distribution point includes at least one of a current and a voltage.

18. The computer system of claim 10 wherein the plurality of load distribution points include at least one of a circuit breaker, a connection terminal, and a fuse.

19. A non-transitory computer readable medium comprising computer executable instructions executable by at least one processor of a computer system, the computer executable instructions including instructions for:
in response to user input, linking a plurality of load distribution points in a power distribution unit to a plurality of electrical loads, wherein each of the electrical loads are electrically coupled to one or more of the plurality of load distribution points;
receiving data indicative of one or more electrical parameters associated with the plurality of load distribution points;
for each of the plurality of load distribution points, selecting a visual indicator from a group of indicators based on the one or more electrical parameters associated with the load distribution point; and
displaying the selected visual indicators for the plurality of load distribution point on a visual display for viewing by a user.

* * * * *